United States Patent
Tanzawa

(10) Patent No.: US 9,728,538 B2
(45) Date of Patent: Aug. 8, 2017

(54) THREE-DIMENSIONAL DEVICES HAVING REDUCED CONTACT LENGTH

(71) Applicant: Micron Technology, Inc., Boise, ID (US)

(72) Inventor: Toru Tanzawa, Adachi (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/154,335

(22) Filed: May 13, 2016

(65) Prior Publication Data

US 2016/0254265 A1    Sep. 1, 2016

Related U.S. Application Data

(60) Continuation of application No. 14/615,830, filed on Feb. 6, 2015, now Pat. No. 9,343,479, which is a division of application No. 13/599,900, filed on Aug. 30, 2012, now Pat. No. 8,952,482.

(51) Int. Cl.

| | |
|---|---|
| *H01L 27/108* | (2006.01) |
| *H01L 21/74* | (2006.01) |
| *H01L 27/02* | (2006.01) |
| *H01L 27/11* | (2006.01) |
| *H01L 27/11531* | (2017.01) |
| *H01L 27/11556* | (2017.01) |
| *H01L 27/11573* | (2017.01) |
| *H01L 27/11582* | (2017.01) |
| *H01L 27/11578* | (2017.01) |

(52) U.S. Cl.
CPC ............ *H01L 27/108* (2013.01); *H01L 21/74* (2013.01); *H01L 27/0207* (2013.01); *H01L 27/11* (2013.01); *H01L 27/11531* (2013.01); *H01L 27/11556* (2013.01); *H01L 27/11573* (2013.01); *H01L 27/11578* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 8,952,482 | B2 | 2/2015 | Tanzawa |
| 9,343,479 | B2 | 5/2016 | Tanzawa |
| 2008/0173928 | A1 | 7/2008 | Arai et al. |
| 2011/0049611 | A1 | 3/2011 | Kiyotoshi et al. |
| 2011/0090737 | A1 | 4/2011 | Yoo et al. |

(Continued)

OTHER PUBLICATIONS

Chiang, M H, et al., "Novel High-Density Low-Power Logic Circuit Techniques Using DG Devices", IEEE ED, 52(10), (2005), 2339-42.

Crowley, Matthew, et al., "512 MB PROM with 8 layers of antifuse/diode cells", 2003 IEEE International Solid-State Circuits Conference, 2003. Digest of Technical Papers. ISSCC, (2003), 284-293.

(Continued)

*Primary Examiner* — Whitney T Moore
(74) *Attorney, Agent, or Firm* — Schwegman Lundberg & Woessner, P.A.

(57) ABSTRACT

Various embodiments comprise apparatuses and methods including a memory array having alternating levels of semiconductor materials and dielectric material with strings of memory cells formed on the alternating levels. One such apparatus includes a memory array formed substantially within a cavity of a substrate. Peripheral circuitry can be formed adjacent to a surface of the substrate and adjacent to the memory array. Additional apparatuses and methods are described.

28 Claims, 7 Drawing Sheets

(56) References Cited

U.S. PATENT DOCUMENTS

| | | |
|---|---|---|
| 2011/0147818 A1 | 6/2011 | Katsumata et al. |
| 2011/0233652 A1 | 9/2011 | Shino et al. |
| 2012/0070944 A1 | 3/2012 | Kim et al. |
| 2012/0091413 A1 | 4/2012 | Nguyen et al. |
| 2012/0108048 A1 | 5/2012 | Lim et al. |
| 2013/0001738 A1* | 1/2013 | Dong ............... H01L 23/49575 257/508 |
| 2014/0061849 A1 | 3/2014 | Tanzawa |
| 2015/0155298 A1 | 6/2015 | Tanzawa |

OTHER PUBLICATIONS

Jang, J., et al., "Vertical cell array using TCAT(Terabit Cell Array Transistor) technology for ultra high density NAND flash memory", Symposium on VLSI Technology, (2009), 192-193.

Johnson, Mark, et al., "512-Mb PROM with a three-dimensional array of diode/antifuse memory cells", IEEE Journal of Solid-State Circuits, 38(11), (2003), 1920-1928.

Katsumata, R., et al., "Pipe-shaped BiCS flash memory with 16 stacked layers and multilevel-cell operation for ultra high density storage devices", Symposium on VLSI Technology, (Jun. 2009), 136-37.

Kim, J., et al., "Novel Vertical-Stacked Array-Transistor (VSAT) for ultra-high-density and cost-effective NAND Flash memory devices and SSD (Solid State Drive)", Symposium on VLSI Technology, (2009), 186-187.

Kim, W., et al., "Multi-layered Vertical Gate NAND Flash overcoming stacking limit for terabit density storage", Symposium on VLSI Technology, (2009), 188-89.

Sakui, K, et al., "Design Impacts on NAND Flash Memory Core Circuits with Vertical MOSFETs", IEEE International Memory Workshop (IMW), (May 2010), 1-4.

Tanzawa, Toru, "Decoding circuits for 3D memory cells", (Nov. 15, 2010), 21 pgs.

* cited by examiner

THREE-DIMENSIONAL DEVICES HAVING REDUCED CONTACT LENGTH

PRIORITY APPLICATION

This application is a continuation of U.S. application Ser. No. 14/615,830, filed Feb. 6, 2015, now issued as U.S. Pat. No. 9,343,479, which is a divisional of U.S. application Ser. No. 13/599,900, filed Aug. 30, 2012, no issued as U.S. Pat. No. 8,952,482, each of which is incorporated herein by reference in its entirety.

BACKGROUND

Computers and other electronic systems, for example, digital televisions, digital cameras, and cellular phones, often have one or more memory and other devices to store information. Increasingly, memory and other devices are being reduced in size to achieve a higher density of storage capacity and/or a higher density of functionality.

DETAILED DESCRIPTION

Figure 1:
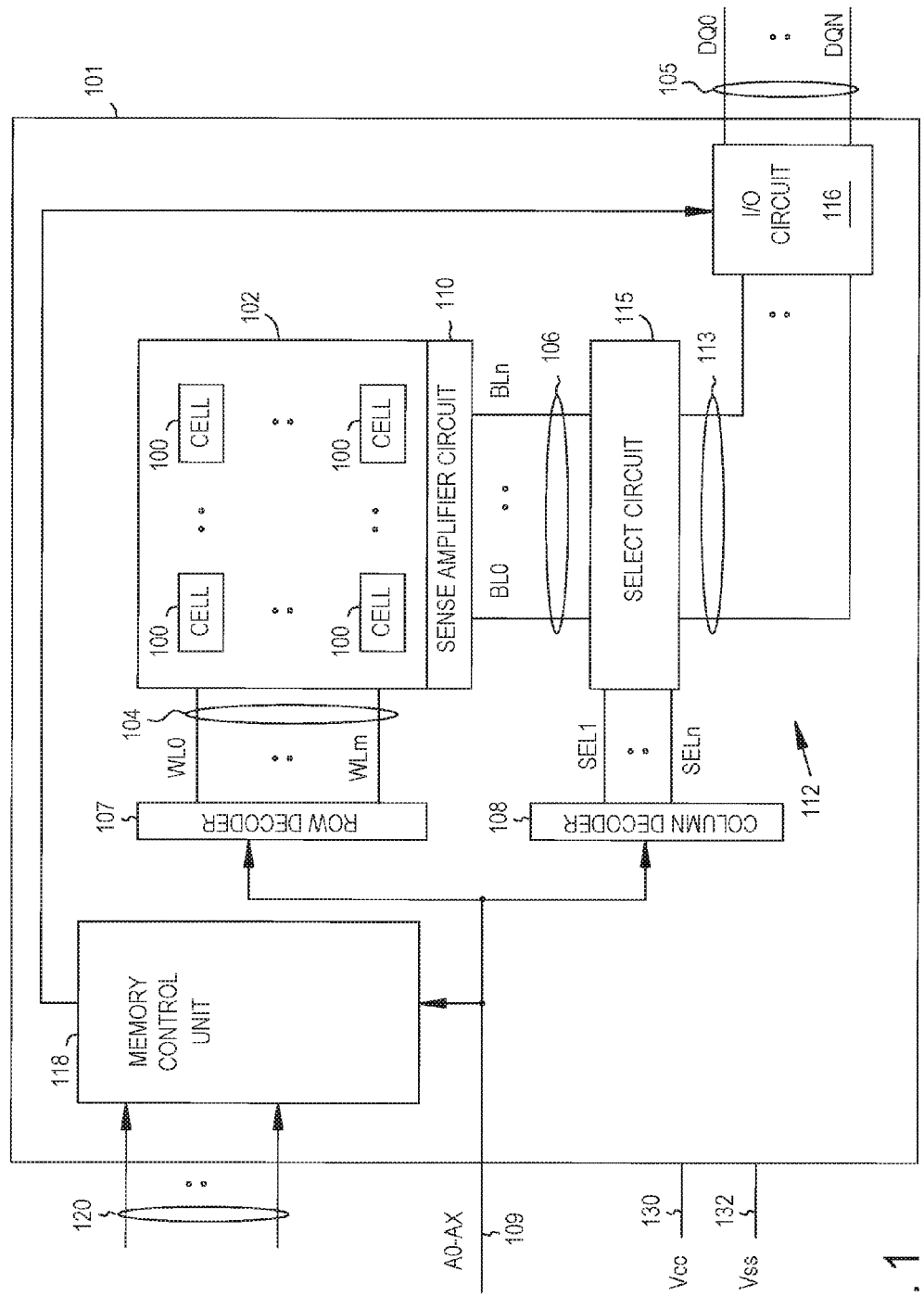
FIG. 1 shows a block diagram of a memory device having a memory array with memory cells, according to an embodiment.

The description that follows includes illustrative apparatuses (circuitry, devices, structures, systems, and the like) and methods (e.g., processes, protocols, sequences, techniques, and technologies) that embody the subject matter. In the following description, for purposes of explanation, numerous specific details are set forth in order to provide an understanding of various embodiments of the subject matter. After reading this disclosure, it will be evident to person of ordinary skill in the art however, that various embodiments of the subject matter may be practiced without these specific details. Further, well-known apparatuses and methods have not been shown in detail so as not to obscure the description of various embodiments. Additionally, although the various embodiments focus on implementation within a memory device, the techniques and methods presented herein are readily applicable to a number of other three-dimensional (3D) electronic devices.

Generally, a 3D electronic device may be considered to be a device formed by a process that combines multiple levels of electronic devices (e.g., one device formed over another) using planar formations (e.g., multiple devices on a single level). Since multiple levels in 3D devices may use approximately the same area on a substrate, an overall density of devices (e.g., memory devices) can be increased in relation to the number of levels. However, simple combinations of, for example, 3D memory cells with peripheral transistors (e.g., formed as CMOS devices) may result in performance degradation due to higher resistance and parasitic values (e.g., higher capacitance) due to the increased heights of contact formations. The increased height of contacts may also lower device yield due to higher failure rates in contact formation. For example, transistors used in multi-level peripheral (e.g., support) circuits tend to have degraded performance characteristics when compared with similar transistors formed by existing planar technologies.

The disclosed subject matter proposes, among other things, various memory device structures that reduce the difference in height from the substrate between 3D memory arrays and peripheral circuits. Moreover, the disclosed subject matter is scalable with an increasing number of levels in 3D stacks. For example, the contacts and interconnections have substantially constant parasitic resistance and capacitance values regardless of the number of levels. Accordingly, transistor and wire performance may remain relatively constant regardless of the number of levels.

The disclosed methods and apparatuses can advantageously be used to, for example, increase cell density while maintaining a relatively small footprint. Further, the methods and apparatuses can be extended to NOR devices, microcontroller devices, other memory types, general purpose logic, and a host of other apparatuses. Various 3D devices including repeating devices (e.g., SRAM), transistors, standard CMOS logic, and so on may all benefit from application of the 3D fabrication processes disclosed herein.

Referring now to FIG. 1, a block diagram of an apparatus in the form of a memory device 101 is shown. The memory device 101 includes one or more memory arrays 102 having a number (e.g., one or more) of memory cells 100 according to an embodiment. The memory cells 100 can be arranged in rows and columns along with access lines 104 (e.g., wordlines to conduct signals WL0 through WLm) and first data lines 106 (e.g., bit lines to conduct signals BL0 through BLn). The memory device 101 can use the access lines 104 and the first data lines 106 to transfer information to and from the memory cells 100. A row decoder 107 and a column decoder 108 decode address signals A0 through AX on address lines 109 to determine which ones of the memory cells 100 are to be accessed.

Sense circuitry, such as a sense amplifier circuit 110, operates to determine the values of information read from the memory cells 100 in the form of signals on the first data lines 106. The sense amplifier circuit 110 can also use the signals on the first data lines 106 to determine the values of information to be written to the memory cells 100.

The memory device 101 is further shown to include circuitry 112 to transfer values of information between the memory array 102 and input/output (I/O) lines 105. Signals DQ0 through DQN on the I/O lines 105 can represent values of information read from or to be written into the memory cells 100. The I/O lines 105 can include nodes of the memory device 101 (e.g., pins, solder balls, or other interconnect technologies such as controlled collapse chip connection (C4), or flip chip attach (FCA)) on a package where the memory device 101 resides. Other devices external to the memory device 101 (e.g., a memory controller or a processor, not shown in FIG. 1) can communicate with the memory device 101 through the I/O lines 105, the address lines 109, or the control lines 120.

The memory device 101 can perform memory operations, such as a read operation, to read values of information from selected ones of the memory cells 100 and a programming operation (also referred to as a write operation) to program (e.g., to write) information into selected ones of the memory cells 100. The memory device 101 can also perform a memory erase operation to clear information from some or all of the memory cells 100.

A memory control unit 118 controls memory operations using signals on the control lines 120. Examples of the signals on the control lines 120 can include one or more clock signals and other signals to indicate which operation (e.g., a programming operation or read operation) the memory device 101 can or should perform. Other devices external to the memory device 101 (e.g., a processor or a memory controller) can control the values of the control signals on the control lines 120. Specific combinations of values of the signals on the control lines 120 can produce a command (e.g., a programming, read, or erase command) that can cause the memory device 101 to perform a corresponding memory operation (e.g., a program, read, or erase operation).

Although various embodiments discussed herein use examples relating to a single-bit memory storage concept for ease in understanding, the inventive subject matter can be applied to numerous multiple-bit schemes as well. For example, each of the memory cells 100 can be programmed to a different one of at least two data states to represent, for example, a value of a fractional bit, the value of a single bit or the value of multiple bits such as two, three, four, or a higher number of bits.

For example, each of the memory cells 100 can be programmed to one of two data states to represent a binary value of "0" or "1" in a single bit. Such a cell is sometimes called a single-level cell (SLC).

In another example, each of the memory cells 100 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to one of more than two data states is sometimes referred to as a multi-level cell (MLC). Various operations on these types of cells are discussed in more detail, below.

The memory device 101 can receive a supply voltage, including supply voltage signals $V_{cc}$ and $V_{ss}$, on a first supply line 130 and a second supply line 132, respectively. Supply voltage signal $V_{ss}$ can, for example, be at a ground potential (e.g., having a value of approximately zero volts). Supply voltage signal $V_{cc}$ can include an external voltage supplied to the memory device 101 from an external power source such as a battery or alternating-current to direct-current (AC-DC) converter circuitry (not shown in FIG. 1).

The circuitry 112 of the memory device 101 is further shown to include a select circuit 115 and an input/output (I/O) circuit 116. The select circuit 115 can respond to signals SEL1 through SELn to select signals on the first data lines 106 and the second data lines 113 that can represent the values of information to be read from or to be programmed into the memory cells 100. The column decoder 108 can selectively activate the SEL1 through SELn signals based on the A0 through AX address signals present on the address lines 109. The select circuit 115 can select the signals on the first data lines 106 and the second data lines 113 to provide communication between the memory array 102 and the I/O circuit 116 during read and programming operations.

The memory device 101 may comprise a non-volatile memory device, and the memory cells 100 can include non-volatile memory cells, such that the memory cells 100 can retain information stored therein when power (e.g., $V_{cc}$, or $V_{ss}$, or both) is disconnected from the memory device 101.

Each of the memory cells 100 can include a memory element having material, at least a portion of which can be programmed to a desired data state (e.g., by being programmed to a corresponding resistance or charge storage state). Different data states can thus represent different values of information programmed into each of the memory cells 100.

The memory device 101 can perform a programming operation when it receives (e.g., from an external processor or a memory controller) a programming command and a value of information to be programmed into one or more selected ones of the memory cells 100. Based on the value of the information, the memory device 101 can program the selected memory cells to appropriate data states to represent the values of the information to be stored therein.

One of ordinary skill in the art may recognize that the memory device 101 may include other components, at least some of which are discussed herein. However, several of these components are not shown in the figure, so as not to obscure details of the various embodiments described. The memory device 101 may include devices and memory cells, and operate using memory operations (e.g., programming and erase operations) similar to or identical to those described below with reference to various other figures and embodiments discussed herein.

Figure 2:
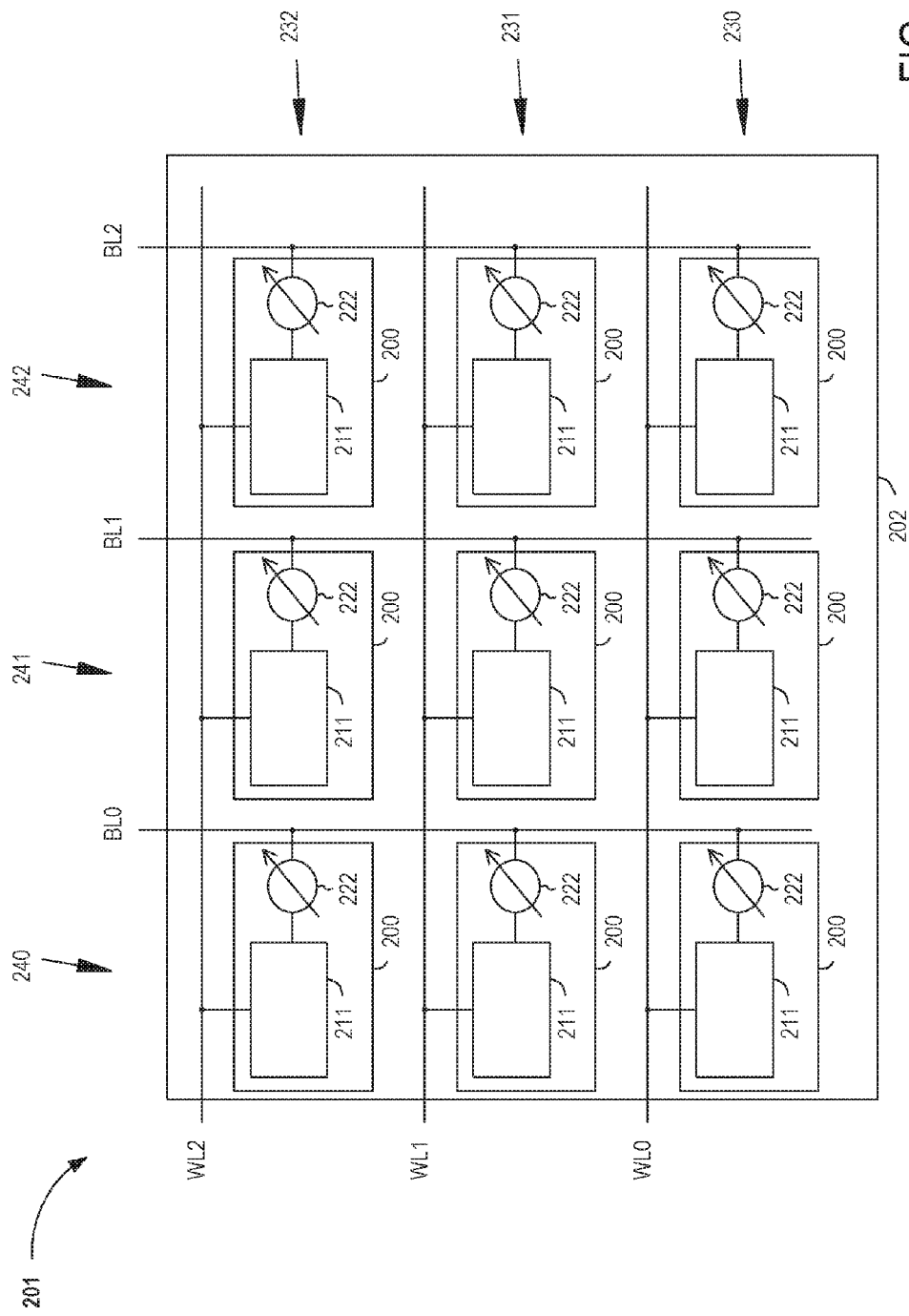
FIG. 2 shows a partial block diagram of a memory device having a memory array including memory cells with access components and memory elements, according to an embodiment.

With reference now to FIG. 2, a partial block diagram of an apparatus in the form of a memory device 201 is shown to include a memory array 202, including memory cells 200 with access components 211 and memory elements 222, according to an example embodiment. The memory array 202 may be similar to or identical to the memory array 102 of FIG. 1. As further shown in FIG. 2, the memory cells 200 are shown to be arranged in a number of rows 230, 231, 232, along with access lines, for example word lines, to conduct signals to the cells 200, such as signals WL0, WL1, and WL2. The memory cells are also shown to be arranged in a number of columns 240, 241, 242 along with data lines, for example bit lines, to conduct signals to the cells 200, such as signals BL0, BL1, and BL2. The access components 211 can turn on (e.g., by using appropriate values of signals WL0, WL1, and WL2) to allow access to the memory elements 222, such as to operate the memory elements 222 as pass elements, or to read information from or program (e.g., write) information into the memory elements 222.

Programming information into the memory elements 222 can include causing the memory elements 222 to have specific resistance states. Thus, reading information from a memory cell 200 can include, for example, determining a resistance state of the memory element 222 in response to a specific voltage being applied to its access component 211. The act of determining resistance may involve sensing a current (or the absence of current) flowing through the memory cell 200 (e.g., by sensing a current of a data line electrically coupled to the memory cell). Based on a measured value of the current (including, in some examples, whether a current is detected at all), a corresponding value of the information stored in the memory can be determined. The value of information stored in a memory cell 200 can be determined in still other ways, such as by sensing a voltage of a data line electrically coupled to the memory cell.

Various ones or all of the memory cells 100, 200 of FIG. 1 and FIG. 2 can include a memory cell having a structure similar or identical to one or more of the memory cells described below.

Figure 3:
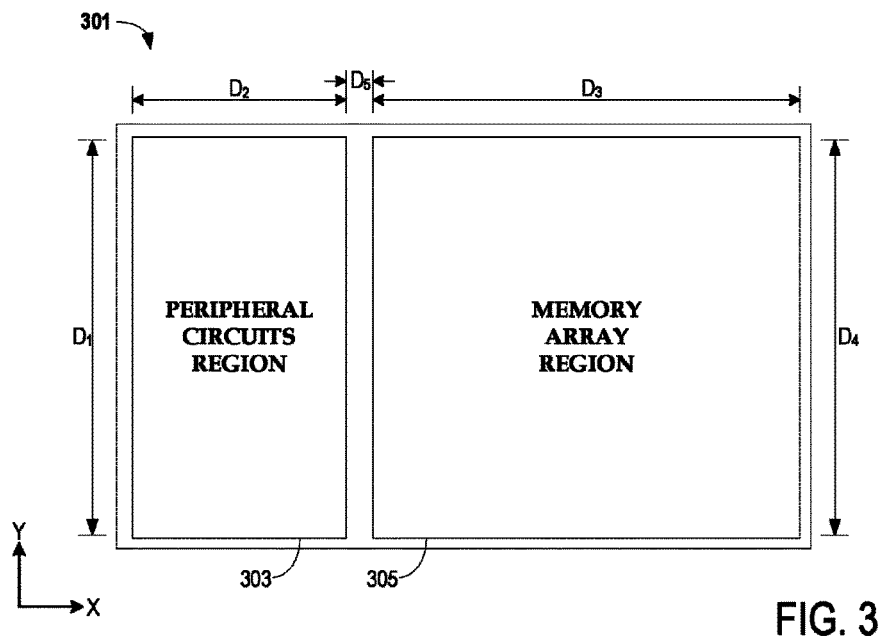
FIG. 3 shows a plan view of a block diagram of a memory device, according to various embodiments.

With reference now to FIG. 3, a block diagram plan view of a memory device 301 is shown. The memory device 301 is shown to include a peripheral circuits region 303 and a memory array region 305. The peripheral circuits region 303 may include support circuits for the memory array region 305 including row decoders, column decoders, sense amplifiers, select circuits, bias circuits, and so on. Each of these support circuits may be similar to or identical to the circuits described above with reference to FIG. 1. The memory array region 305 may comprise various types of volatile or non-volatile memory cells including flash memory, conductive-bridging random access memory (CBRAM), resistive RAM (RRAM), phase change memory (PCM), static RAM (SRAM), dynamic RAM (DRAM), or various other types and combinations of types of memory devices.

In a specific embodiment, the peripheral circuits region 303 may have a first dimension, $D_1$, of approximately 10 mm and a second dimension, $D_2$, of approximately 5 mm. The memory array region 305 may have a first dimension, $D_3$, of approximately 10 mm and a second dimension, $D_4$, of approximately 10 mm. The peripheral circuits region is located adjacent to a peripheral (e.g., outside) edge of a substrate of the memory device 301 and adjacent (e.g., laterally adjacent) to the memory array region 305. The peripheral circuits region 303 and the memory array region 305 are separated by a distance, $D_5$, of approximately 1 micrometer (micron). Dimensions larger or smaller than those described may be employed. Thus, the specific dimensions given herein are provided merely to assist the person of ordinary skill in the art in more fully understanding the subject matter.

Figure 4A:
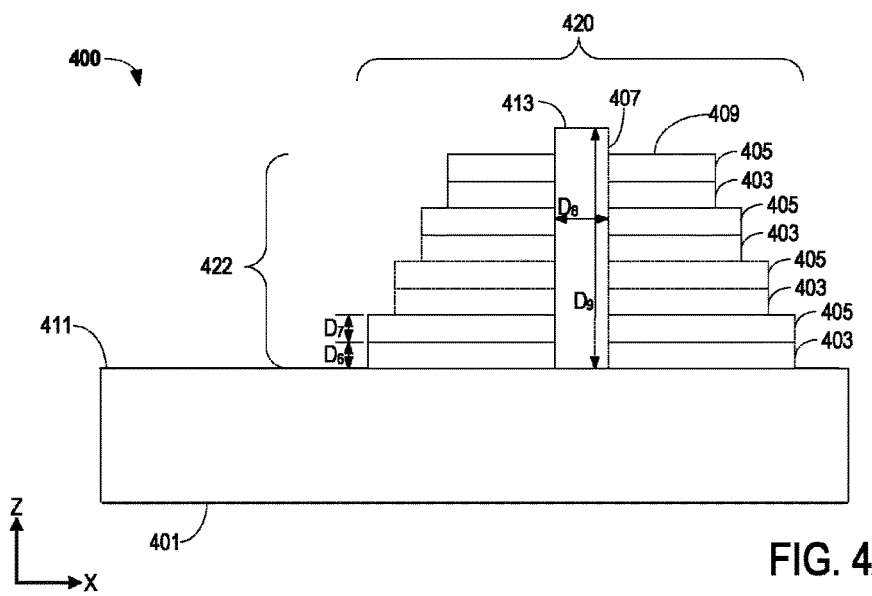
FIG. 4A through FIG. 4D show elevational views during various operations performed in the formation of a memory device, according to an embodiment.

FIG. 4A through 4D show elevational views during various operations performed in the formation of a memory device 400. Referring specifically to FIG. 4A, an elevational view of the memory device 400 is shown to include a substrate 401 with a memory array 420 (e.g., a memory structure) formed proximate to (e.g., on) a surface 411 of the substrate 401. The memory array 420 comprises a stack 422 formed of alternating levels of semiconductor materials 405 and dielectric materials 403 surrounding a pillar 407. The pillar 407 may electrically couple the levels of semiconductor materials 405 together.

As shown in FIG. 4A, each of the levels of the semiconductor material 405 is separated from a respective adjacent one of the levels of the semiconductor material 405 by at least a respective one of the levels of the dielectric material 403. Although only four levels of each of the levels of semiconductor material 405 and each of the levels of the dielectric material 403 are shown, a skilled artisan will recognize that any number of levels may be formed on the surface 411 of the substrate 401.

The substrate 401 may comprise, for example, any of various substrate semiconducting types used in the semiconductor and allied industries. Substrate types may therefore include silicon wafers, compound semiconductor wafers, thin film head assemblies, polyethylene-terephthalate (PET) films deposited or otherwise formed with a semiconductor layer (followed by an annealing activity, such as excimer laser annealing (ELA) in some embodiments), or numerous other types of substrates known independently in the art. In addition to silicon, various other elemental semiconductor materials may also be considered. Further, the substrate 401 may comprise a region of a semiconductor material formed over a non-semiconductor material (e.g., quartz, ceramic, etc.). For ease of understanding the fabrication activities that follow, the substrate 401 may be considered to be a silicon wafer. Upon reading and understanding the disclosure provided herein, a person of ordinary skill in the art will understand how to modify the fabrication activities and operations disclosed to account for other types of materials and electronic devices.

The dielectric materials 403 may comprise one or more dielectric materials known in the art. For example, the various dielectric materials may comprise silicon dioxide ($SiO_2$), silicon nitride ($Si_xN_y$), aluminum oxide ($Al_2O_3$), tantalum pentoxide ($Ta_2O_5$), hafnium oxide ($HfO_2$), or a variety of other organic or inorganic dielectric materials, each of which may be used as an alternative to or in conjunction with others of the materials described. Also, various other combinations of materials may also be substituted or included.

The semiconductor material 405 may comprise any of a number of types of single-crystal or amorphous semiconductor materials. For example, the semiconductor material 405 may be an epitaxial deposition of silicon, other elemental semiconductor, or compound semiconductor. In other examples, the semiconductor material 405 may be a poly-silicon material (e.g., a conductively doped polysilicon material) formed by, for example, thermal decomposition or pyrolysis of silane such as a low-pressure chemical vapor deposition (LPCVD) process. Other techniques known independently in the art, such as DC sputtering, followed by a post-anneal activity in some embodiments, may also be utilized.

In a specific example, each of the levels of semiconductor material 405 and each of the levels of the dielectric material 403 are shown as having a dimension, $D_7$ and $D_6$ respectively, as approximately 50 nm each. However, dimensions larger or smaller than these may be employed.

The pillar 407 may comprise a (e.g., conductively doped) semiconductor material. The semiconductor material may comprise any one or more of the elemental or compound semiconductor materials discussed above. In an example, the pillar 407 comprises channel material (e.g., any one or more of the semiconductor materials disclosed herein). Therefore, in various embodiments, a string of memory cells (e.g., a NAND string of memory cells) may be formed along the semiconductor material 405 levels.

In a specific example, a dimension, $D_8$, of the pillar 407 is approximately 50 nm. An overall height, indicated by dimension $D_9$, will depend at least partially on the number and thicknesses of alternating levels of the semiconductor materials 405 and the dielectric materials 403. Also, as shown in FIG. 4A, an upper surface 413 of the pillar 407 extends above an upper surface 409 of the uppermost level of the levels of the semiconductor material 405. The upper surfaces 409, 413 may therefore be considered distal to the surface 411 of the substrate 401. The difference in height between the upper surface 413 of the pillar 407 and the upper surface 409 of the semiconductor material 405 may vary. In some embodiments, the upper surface 413 of the pillar 407 may be substantially coplanar with or below the upper surface 409 of the semiconductor material 405. A person of ordinary skill in the art will recognize that terms such as "upper" and "above" are being used as relative terminology with respect to a chosen plane, and are not being used in a specific fashion with respect to a fixed plane.

Figure 4B:
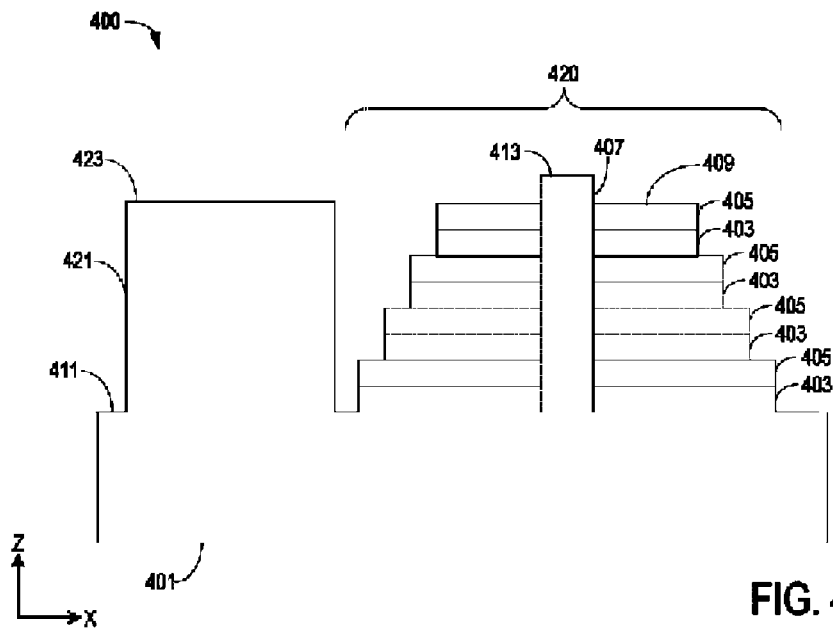

With reference now to FIG. 4B, an elevated portion 421 (e.g., a peripheral structure) is formed on the surface 411 of the substrate 401 laterally adjacent to (e.g., near) a peripheral edge of the memory array 420. In various embodiments, the elevated portion 421 is formed such that an uppermost surface 423 of the elevated portion 421 is substantially coplanar with (e.g., above, below, or similar in height to) the upper surface 409 of the stack 422 of semiconductor materials 405. In various embodiments, the elevated portion 421 is formed such that an uppermost surface 423 of the elevated portion 421 is substantially coplanar with (e.g., above, below, or similar in height to) the upper surface 413 of the pillar 407. As used herein, "substantially co-planar" may include, for example, within +/− 50% of an overall height of the pillar 407, indicated by dimension $D_9$. In other examples, "substantially co-planar" may include, for example, within +/− 10% or less of an overall height of the pillar 407, indicated by dimension $D_9$.

In various embodiments, the elevated portion 421 may comprise epitaxial silicon formed on the surface 411 of the substrate 401. In various embodiments, the elevated portion 421 may be a semiconductor material (e.g., single crystal or amorphous silicon, germanium, other elemental semiconductor material, compound semiconductor material, etc.) formed (e.g., through various deposition techniques) on the surface 411 of the substrate 401. In various embodiments, the elevated portion 421 may be a dielectric material formed on the surface 411 of the substrate 401 and having exposed portions covered with one or more of the various semiconductor materials described herein to electrically couple the elevated portion 421 to the substrate 401.

Figure 4C:
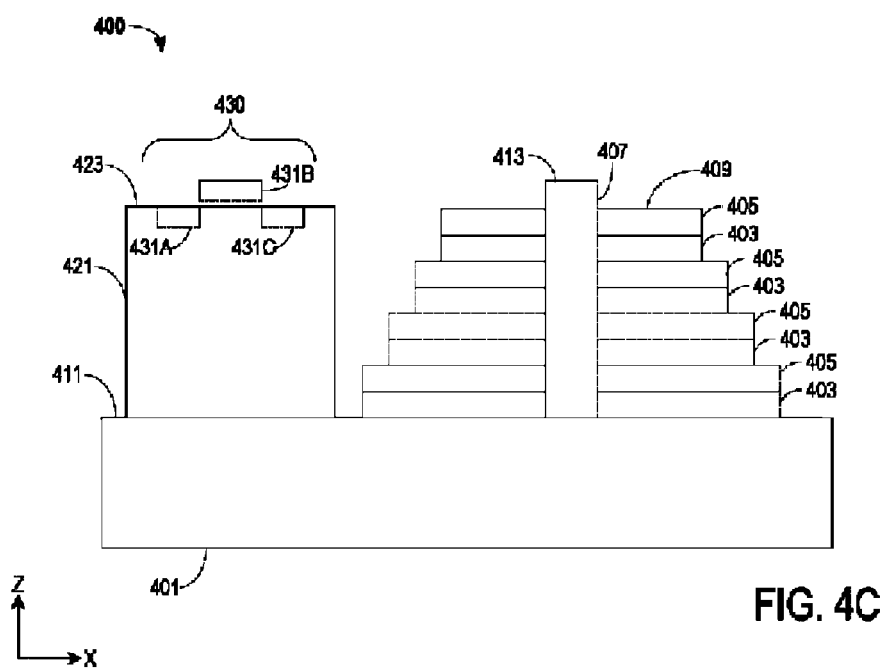

FIG. 4C shows one or more devices 430 formed adjacent to (e.g., on and/or in) the uppermost surface 423 of the elevated portion 421. The one or more devices 430 may operably interface with (e.g., be electrically or optically coupled to) the memory array 420.

In various embodiments, the devices 430 may comprise active components (e.g., transistors, registers, etc.). For example, a first structure 431A and a third structure 431C may be wells of a transistor. A second structure 431B may be a transistor gate. In various embodiments, the first structure 431A, the second structure 431B, and the third structure 431C may comprise passive components. For example, the first structure 431A and the third structure 431C may be inductors formed into the elevated portion 421. The second structure 431B may be a portion of a capacitor formed above the elevated portion 421. In various embodiments, the first structure 431A, the second structure 431B, and the third structure 431C may comprise a mix of active and passive components.

As will be explained in more detail with reference to FIG. 4D, below, the elevated portion 421 allows a reduction in the height of contacts (e.g., ohmic or optical contacts) formed between the devices 430 and an interconnect (e.g., a metal line or an optical waveguide) that is formed later in the fabrication process.

Figure 4D:
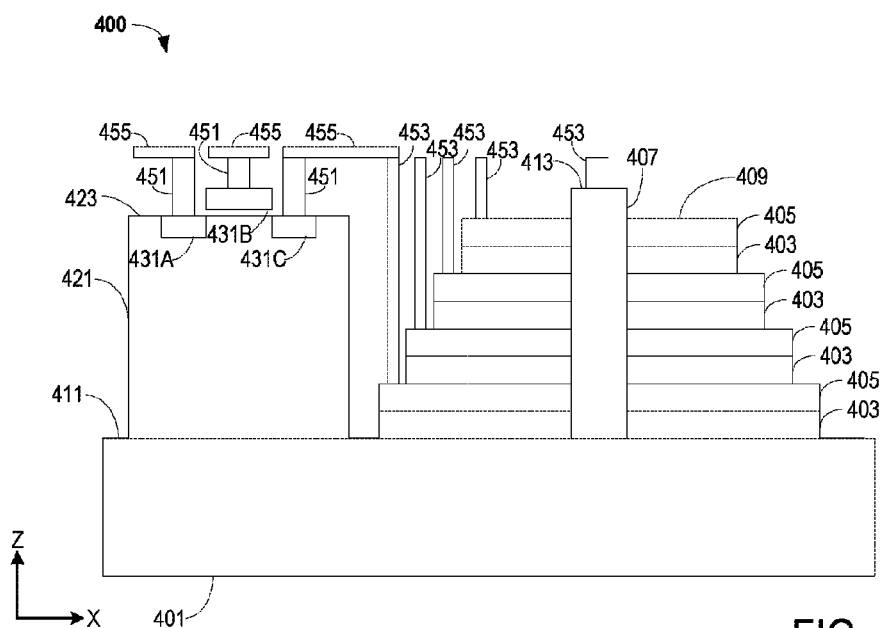

FIG. 4D shows a number of memory array contacts 453 and a number of device contacts 451. In some embodiments, the contacts 451, 453 may be formed substantially concurrently. In some embodiments, either the memory array contacts 453 or the device contacts may be formed first. Interconnects 455 may be used to interconnect various portions of the devices 430, the memory array 420, and other devices external to the memory device 400. As will be apparent to a person of ordinary skill in the art, only a portion of the contacts are shown to preserve clarity of the drawings.

With the devices 430 being formed on and/or in the elevated portion 421, it can be seen that the overall height of the device contacts 451 is reduced when compared with forming the devices 430 on the surface 411 of the substrate 401. That is, a conventional process in which the devices are formed on the surface of the substrate would require the device contacts to be a greater height in order to reach the same level (e.g., to couple to the interconnects) as the memory array contacts. The greater height increases the resistance of the contacts, and may have a detrimental effect on other electrical factors (e.g., increased parasitic capacitance and inductance) of the device contacts, for example.

Further, since the device contacts 451 have a reduced height compared with other contact formation processes, vias prepared to form the contacts also have a reduced height. Consequently, the tolerance with which the vias are placed may be relaxed due the reduced height. With a shorter overall height of the vias, and the subsequently formed device contacts 451, the precision and accuracy of placement of each of the vias may be less critical. Taller (e.g., higher) ones of the memory array contacts 453 can be located on edges of levels of the semiconductor materials 405 that are closer to the surface 411 of the substrate 401. However, since a greater area is available in which the memory array contacts 453 may be coupled to the semiconductor materials 405, a relaxed design rule (e.g., a greater tolerance for placement of the vias and the subsequently formed contacts) is possible. Thus, using various embodiments described herein, a person of ordinary skill in the art will recognize that desirable electrical properties of the device contacts 451 may be increased (e.g., improved conductivity due to reduced resistance) at the same time the tolerance of contact placement during device formation may be relaxed.

Moreover, the various embodiments described allow for enhanced scalability of three-dimensional memory devices. For example, as an increasing number of levels are added to a memory device, the device contacts 451 may have a consistent parasitic resistance, capacitance, and inductance since the elevated portion 421 can be scaled to match the height of the memory array 420 (FIG. 4A). As more levels are added to the memory array 420, the height of the elevated portion 421 can be increased. Thus, the device contacts 451 remain fairly consistent in height regardless of the number of levels in the memory array 420.

Figure 5A:
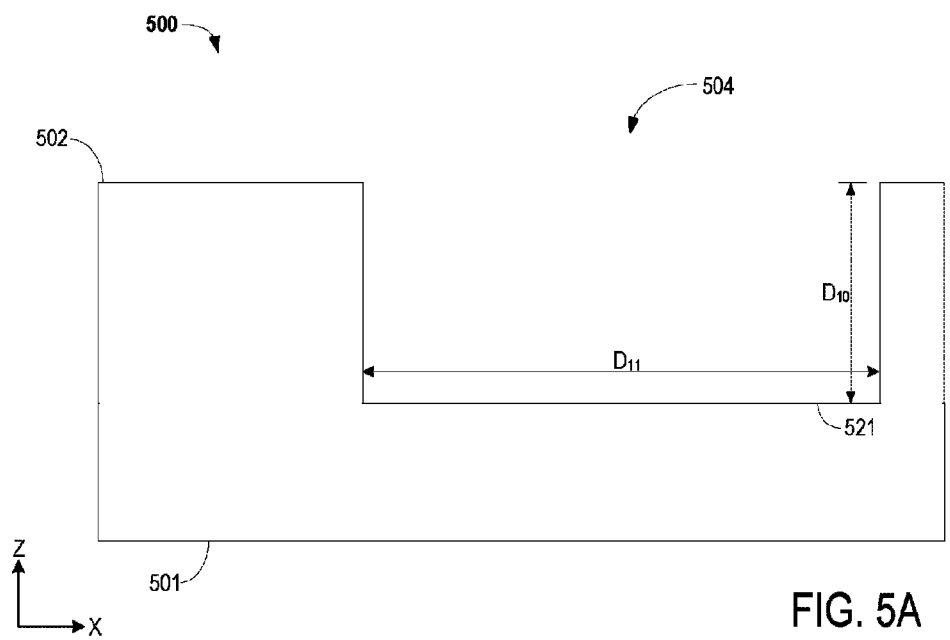
FIG. 5A through FIG. 5C show elevational views during various operations performed in the formation of a memory device, according to an embodiment.
Figure 5B:
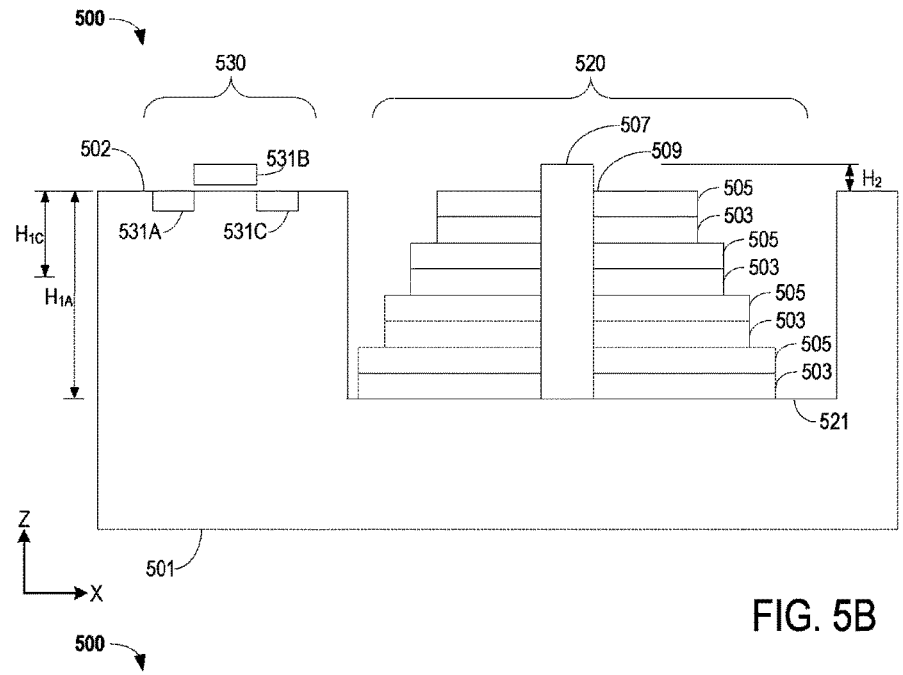
Figure 5C:
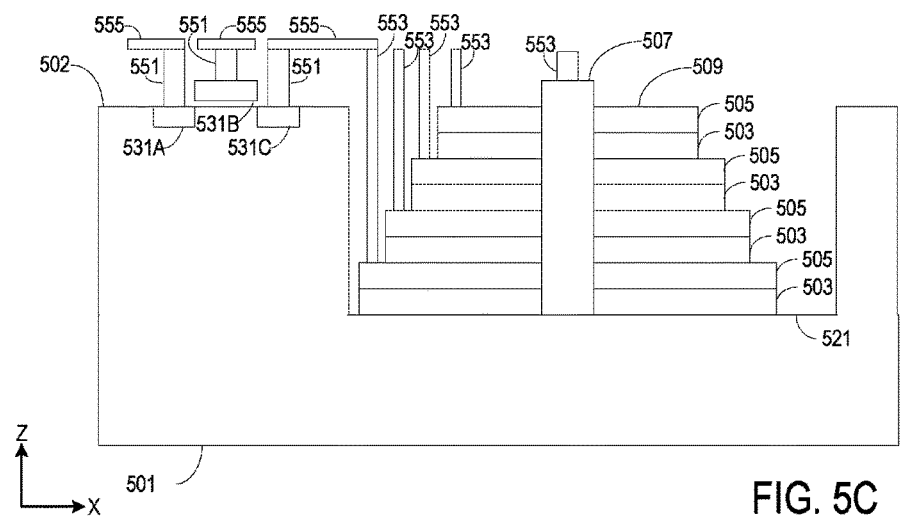

Referring now to FIG. 5A through FIG. 5C, elevational views during various operations performed in the formation of a memory device 500 are shown. Specifically with reference now to FIG. 5A, a cavity 504, having a lower surface 521, is formed in a substrate 501. The substrate 501 may be similar to the substrate 401 described above with reference to FIG. 4A through FIG. 4D, above. For example, the substrate 501 may, for example, comprise elemental or compound semiconductors, dielectric materials covered with a semiconductor material, or a number of combinations of materials described herein.

In one embodiment, the cavity 504 is a trench. In other embodiments, the opening can be comprised of geometries other than a trench. However, for ease in understanding fabrication of the inventive subject matter discussed herein, the cavity 504 can be considered to be an opening (e.g., an aperture) formed within the substrate 501.

The cavity 504 may be formed with dimensions suitable for a later-formed memory array. For example, in a specific embodiment, the cavity 504 has a first dimension, $D_{11}$, of approximately 10 mm as measured along a surface 502 of the substrate 501. However, this dimension may vary depending upon dimensions $D_3$ and $D_4$ of the memory array region 305 of FIG. 3.

The second dimension, $D_{10}$, is dependent, at least partially, on the thicknesses and number of levels of the later-formed memory array that are to be formed substantially within (e.g., in some embodiments, entirely within) the cavity 504. For example, assuming 16 alternating levels of the semiconductor materials 405 and the dielectric materials 403, with each layer having dimensions $D_7$ and $D_6$ of 50 nm each as described with reference to FIG. 4A, the second dimension $D_{10}$ is approximately 1.6 microns. The second dimension, $D_{10}$, of the cavity 504 may be selected so that an upper surface of a later-formed memory array is substantially coplanar with (e.g., above, below, or similar in height to) the surface 502 of the substrate 501. In various embodiments, the cavity 504 may be formed in the substrate 501 to a depth (e.g., the second dimension, $D_{10}$) that is substantially equivalent to the height of a 3D memory array comprising multiple levels of memory cells as described above, and formed substantially within the cavity 504. However, the cavity 504 may be formed to any dimensions and shapes as discussed, by way of example, below.

For example, in a specific embodiment, the cavity 504 may be formed by an anisotropic dry etch process (e.g., reactive-ion etch (RIE), plasma etch, etc.). In other embodiments, the cavity 504 may be formed by various types of chemical anisotropic etchants (e.g., such as potassium hydroxide (KOH), tetramethyl ammonium hydroxide (TMAH), etc.), mechanical etching techniques, other types of ion milling, laser ablation techniques, etc. In the case of a chemical etchant, various lattice planes as found in, for example, single crystal materials, can assist in vertical sidewall formation. However, in other embodiments, vertical sidewall formation is not necessary and a sidewall slope to the cavity 504 may be present in certain applications. Therefore, although primarily anisotropic etchants and milling techniques have been discussed, isotropic etchants may also be employed. For example, a hydrofluoric/nitric/acetic (HNA) acid chemical etchant may be used. Related industries such as micro-electrical mechanical systems (MEMS) may independently supply techniques for still further means to form the cavity 504.

In FIG. 5B, a memory array 520 is formed on a lower surface 521 and at least partially within the cavity 504 of the substrate 501. In some embodiments, the memory array 520 may be formed completely within the cavity 504. In some embodiments, the memory array 520 may be formed primarily, but not entirely, within (e.g., substantially within) the cavity 504. The memory array 520 may be similar to or identical to the memory array 420 (FIG. 4A) and comprises alternating levels of semiconductor materials 505 and dielectric materials 503 with a pillar 507. As shown in FIG. 5B, each of the levels of the semiconductor material 505 is separated from a respective adjacent one of the levels of the semiconductor material 505 by at least a respective one of the levels of the dielectric material 503. Although only four levels of each of the levels of the semiconductor material 505 and each of the levels of the dielectric material 503 are shown, a skilled artisan will recognize that any number of levels may be formed in the memory array 520. Each of the levels of the semiconductor material 505 and of the dielectric material 503 may be formed from materials similar to the semiconductor material 405 and the dielectric material 503 described above with reference to FIG. 4A.

With continuing reference to FIG. 5B, one or more devices 530 are formed on and/or in the surface 502 of the substrate 501. The one or more devices 530 may operably interface with the memory array 520. In an example, a channel of the one or more devices may have a distance, $H_{1C}$, below the surface 502 of greater than 100 nm. In an example, a bottom portion (e.g., on the lower surface 521) of the memory array 520 may have a distance, $H_{1A}$, below the surface 502 of greater than 1 μm. In an example, a top portion of the pillar 507 may be at a distance $H_2$, above the surface 502 of less than 100 nm. In an example, a top portion of the pillar 507 may be at a distance $H_2$, above the surface 502 of less than 1 μm. Each of these measurements is provided simply as examples. Other distances, greater or smaller than these, may be used as well.

In various embodiments, and as discussed above with reference to FIG. 4C, the one or more devices 530 may comprise active components (e.g., transistors, registers, etc.). For example, a first structure 531A and a third structure 531C may be wells of a transistor. A second structure 531B may be a transistor gate. In various embodiments, the first structure 531A, the second structure 531B, and the third structure 531C may be passive components. For example, the first structure 531A and the third structure 531C may be inductors formed into or on the surface 502 of the substrate 501. The second structure 531B may be a portion of a capacitor formed above the substrate 501. In various embodiments, the first structure 531A, the second structure 531B, and the third structure 531C may comprise a mix of active and passive components.

As described above with reference to FIG. 4D, above, the cavity 504 formed into the substrate 501 allows a reduction in the height of contacts formed between the one or more devices 530 and an interconnect that is formed later in the fabrication process.

FIG. 5C shows a number of memory array contacts 553 and a number of device contacts 551. In various embodiments, the contacts 551, 553 may be formed substantially concurrently. In some embodiments, either the memory array contacts 553 or the device contacts may be formed first. Interconnects 555 may be used to interconnect various portions of the one or more device 530, the memory array 520, and other devices external to the memory device 500. As will be apparent to a person of ordinary skill in the art, only a portion of the contacts are shown to preserve clarity of the drawings.

Since the one or more devices 530 are formed on and/or in the surface 502 of the substrate 501, with the memory arrays 520 formed at least partially in the cavity 504 (and therefore most or all of the levels are substantially below the surface 502 of the substrate 501), the overall height of the device contacts 551 is reduced when compared with forming the memory array 520 on the surface 502 of the substrate 501. Thus, similar to the description of the device contacts 451 given with reference to FIG. 4D, above, the reduced height may reduce the resistance of the device contacts 551 as well as potentially reducing any detrimental effects on other electrical factors (e.g., parasitic capacitance and inductance) of the device contacts as well.

Figure 6:
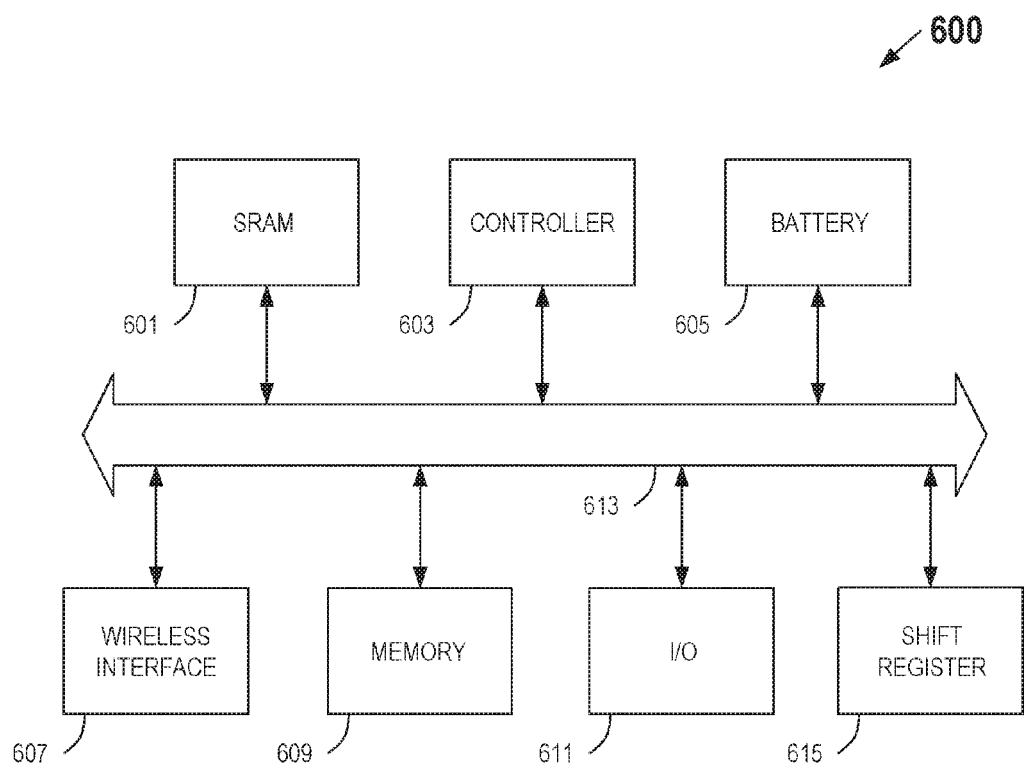
FIG. 6 is a block diagram of a system embodiment, including a memory device according to various embodiments described herein.

FIG. 6 is a block diagram of a system 600 with a memory device that may include one or more of the various embodiments described herein. The system 600 is shown to include a controller 603, an input/output (I/O) device 611 (e.g., a keypad, a touchscreen, or a display), a memory device 609, a wireless interface 607, a static random access memory (SRAM) device 601, and a shift register 615, each coupled to each other via a bus 613. A battery 605 may supply power to the system 600 in one embodiment. The memory device 609 may include a NAND memory, a flash memory, a NOR memory, a combination of these, or the like. The memory device 609 may include one or more of the novel devices and structures described herein.

The controller 603 may include, for example, one or more microprocessors, digital signal processors, micro-controllers, or the like. The memory device 609 may be used to store information transmitted to or by the system 600. The memory device 609 may optionally also be used to store information in the form of instructions that are executed by the controller 603 during operation of the system 600 and may be used to store information in the form of user data either generated, collected, or received by the system 600 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 603 may include one or more of the novel devices and structures described herein.

The I/O device 611 may be used to generate information. The system 600 may use the wireless interface 607 to transmit and receive information to and from a wireless communication network with a radio frequency (RF) signal. Examples of the wireless interface 607 may include an antenna, or a wireless transceiver, such as a dipole antenna. However, the scope of the inventive subject matter is not limited in this respect. Also, the I/O device 611 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 611 may include one or more of the novel devices and structures described herein.

The various illustrations of the procedures and apparatuses are intended to provide a general understanding of the structure of various embodiments and are not intended to provide a complete description of all the elements and features of the apparatuses and methods that might make use of the structures, features, and materials described herein. Based upon a reading and understanding of the disclosed subject matter provided herein, a person of ordinary skill in the art can readily envision other combinations and permutations of the various embodiments. The additional combinations and permutations are all within a scope of the present invention.

The Abstract of the Disclosure is provided to comply with 37 C.F.R. §1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method of forming an apparatus, the method comprising:
   forming a cavity in a semiconductor substrate;
   forming a three-dimensional circuit substantially within the cavity, the cavity having a depth substantially equivalent to a height of the three-dimensional circuit; and
   forming support circuitry adjacent to the cavity and proximate to a surface of the semiconductor substrate, an upper surface of the support circuitry being substantially coplanar with an upper surface of the three-dimensional circuit.

2. The method of claim 1, further comprising forming the support circuitry to include passive electrical components.

3. The method of claim 1, further comprising forming the support circuitry to include active electrical components.

4. The method of claim 1, further comprising:
   forming the three-dimensional circuit to be a memory array having alternating layers of semiconductor materials and dielectric materials; and
   forming each of the layers of semiconductor materials to be separated from a respective adjacent one of the layers of semiconductor materials by one of the layers of dielectric materials.

5. The method of claim 4, further comprising forming a pillar of semiconductor material to electrically couple adjacent ones of the layers of semiconductor materials.

6. The method of claim 4, further comprising forming the alternating layers to be stepped such that an uppermost surface of at least one end of a lower layer of each of the semiconductor material layers extends beyond an overlying one of the semiconductor material layers and the dielectric material layers.

7. The method of claim 1, further comprising forming the support circuitry to include row decoders, column decoders, sense amplifiers, and select circuits.

8. The method of claim 1, wherein the cavity comprises a trench formed in the semiconductor substrate.

9. The method of claim 1, further comprising forming the cavity in a material selected from an elemental semiconductor and a compound semiconductor.

10. A device, comprising:
    a three-dimensional circuit substantially formed substantially within a cavity of a semiconductor substrate; and
    support circuitry formed adjacent to the cavity and proximate to a surface of the semiconductor substrate, an upper surface of the support circuitry being substantially coplanar with an upper surface of the three-dimensional circuit.

11. The device of claim 10, wherein the cavity has a depth substantially equivalent to a height of the three-dimensional circuit.

12. The device of claim 10, wherein the support circuitry is formed lateral to the cavity.

13. The device of claim 10, wherein the upper surface of the support circuitry is substantially coplanar with an upper surface of a memory array to reduce an overall height of support circuitry contacts to couple the support circuitry contacts from the support circuitry to respective ones of a plurality of interconnects, the plurality of interconnects being formed between the three-dimensional circuit and the support circuitry.

14. The device of claim 13, wherein a height of the longest contacts coupled to the three-dimensional array are substantially longer than the contacts coupled to the support circuitry.

15. The device of claim 10, wherein the three-dimensional circuit is a memory array having alternating layers of semiconductor materials and dielectric materials, each of the layers of semiconductor materials being separated from a respective adjacent one of the layers of semiconductor materials by one of the layers of dielectric materials.

16. The device of claim 15, further comprising strings of memory cells formed along the alternating layers.

17. The device of claim 15, wherein the alternating layers are stepped such that an uppermost surface of at least one end of a lower layer of each of the semiconductor material layers extends beyond an overlying one of the semiconductor material and the dielectric material layers.

18. The device of claim 10, wherein he cavity has substantially vertical sidewalls.

19. The device of claim 10, wherein the cavity has sloped sidewalls.

20. A device, comprising:
a memory array having alternating layers of semiconductor materials and dielectric materials that are substantially parallel to a substrate on which they are formed, the memory array being formed at least partially within a cavity of a substrate, each of the layers of semiconductor materials being separated from a respective adjacent one of the layers of semiconductor materials by one of the layers of dielectric materials; and
peripheral circuitry formed in or on a surface of the substrate and lateral to the memory array, an upper surface of the peripheral circuitry being substantially coplanar with an upper surface of the memory array to reduce an overall height of and to reduce a resistance of peripheral circuitry contacts to couple the peripheral circuitry contacts from the peripheral circuitry to respective ones of a plurality of interconnects, the plurality of interconnects being formed between the peripheral circuitry and the memory array.

21. The device of claim 20, wherein the upper surface of the memory array is substantially coplanar with an uppermost surface of the substrate.

22. The device of claim 20, wherein the substrate comprises at least one material selected from materials consisting of elemental semiconductor wafers, compound semiconductor wafers, thin film head assemblies, and polyethyleneterephthalate (PET) films having a semiconductor layer formed thereon.

23. The device of claim 20, wherein the substrate comprises a region of a semiconductor material formed over a non-semiconductor material.

24. The device of claim 23, wherein the non-semiconductor material comprises at least one material selected from materials including quartz and ceramic.

25. The device of claim 20, wherein the peripheral circuitry comprises at least one of active devices to control operations of the memory array and passive components related to operations of the memory array.

26. A method of forming a device, the method comprising:
forming a cavity in a substrate to a depth substantially equivalent to a height of a memory array;
forming the memory array having alternating layers of semiconductor materials and dielectric materials that are substantially parallel to a substrate on which they are formed, each of the layers of semiconductor materials to be separated from a respective adjacent one of the layers of semiconductor materials by one of the layers of dielectric materials substantially within the cavity; and
forming support circuitry lateral to the cavity and on or in a surface of the substrate, an uppermost surface of the support circuitry being substantially coplanar with an uppermost surface of the memory array.

27. The method of claim 26, further comprising forming a pillar from a semiconductor material, the pillar extending a lower portion of the memory array to an uppermost portion of the memory array.

28. The method of claim 27, further comprising selecting the uppermost surface of the support circuitry being substantially coplanar with an uppermost surface of the memory array to be within 10% of an overall height of the pillar.

* * * * *